United States Patent [19]

Schaper et al.

[11] Patent Number: 5,317,176

[45] Date of Patent: May 31, 1994

[54] POWER TRANSISTOR HAVING MULTIFINGER CONTACTS

[75] Inventors: Ulrich Schaper; Birgit Holzapfl, both of Munich, Fed. Rep. of Germany

[73] Assignee: Siemens Aktiengesellschaft, Munich, Fed. Rep. of Germany

[21] Appl. No.: 25,667

[22] Filed: Mar. 3, 1993

[30] Foreign Application Priority Data

Mar. 12, 1992 [DE] Fed. Rep. of Germany ....... 4207909

[51] Int. Cl.[5] ...................... H01L 27/02; H01L 23/48
[52] U.S. Cl. .................................... 257/287; 257/341; 257/401; 257/578; 257/773
[58] Field of Search ............... 257/287, 401, 773, 578, 257/579, 566, 341, 343, 207, 775, 712, 723

[56] References Cited

U.S. PATENT DOCUMENTS 3,704,398 11/1972 Fukino ............................. 257/287
3,943,546 3/1976 Kaiser .............................. 257/287
4,642,668 2/1987 Tacken ............................ 257/287

OTHER PUBLICATIONS

"Thermal Design Studies of High-Power Heterojunction Bipolar Transistors", by Gao et al., IEEE Transactions on Electron Devices, vol. 36, No. 5, May 1989, pp. 854–863.

"Emitter Ballasting Resistor Design for, and Current Handling Capability of AlGaAs/GaAs Power Heterojunction Bipolar Transistors", by Gao et al., IEEE Transactions on Electron Devices, vol. 38, No. 2, Feb. 1991, pp. 185–196.

"Steady-State Junction Temperatures of Semiconductor Chips", by R. D. Lindsted et al., IEEE Transactions on Electron Devices, vol. 19, No. 1, Jan. 1972, pp. 41–44.

"Uniform junction temperature AlGaAs/GaAs power heterojunction bipolar transistors on silicon substrates", by Gao et al., Appl. Phys. Letter 58 (10), Mar. 11, 1991, pp. 1068–1070.

Primary Examiner—Mark V. Prenty
Attorney, Agent, or Firm—Hill, Steadman & Simpson

[57] ABSTRACT

A power transistor has a plurality of contacted, individual transistors. The contacts of these individual transistors are arranged at such intervals from one another that a temperature distribution results during operation that is substantially uniform for an intended power range of the transistor.

17 Claims, 2 Drawing Sheets

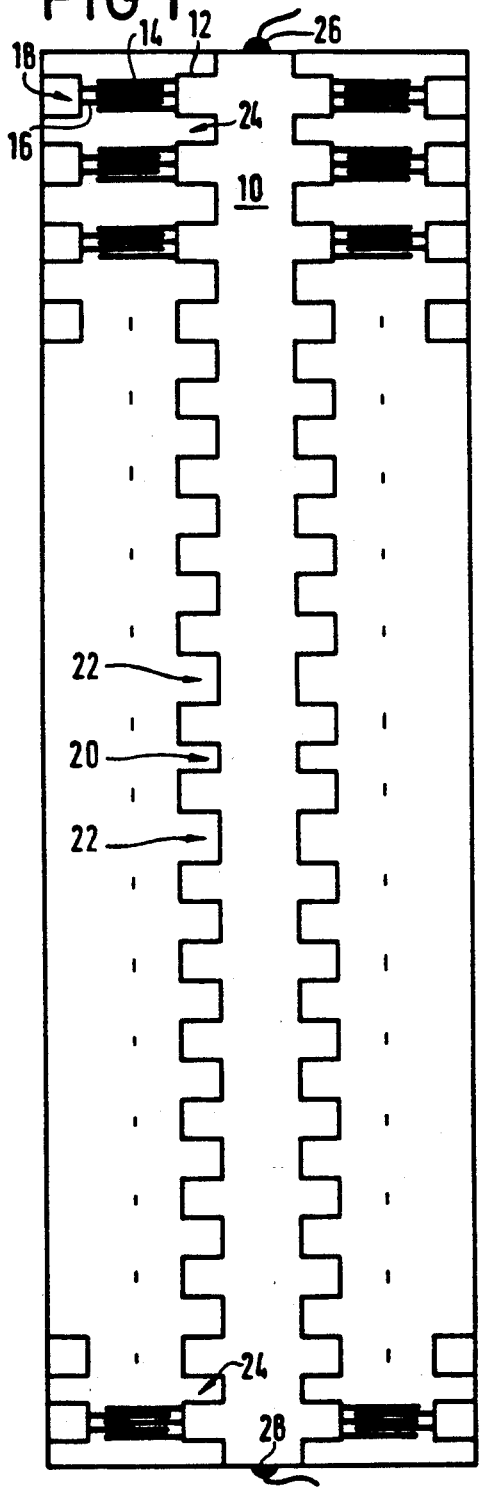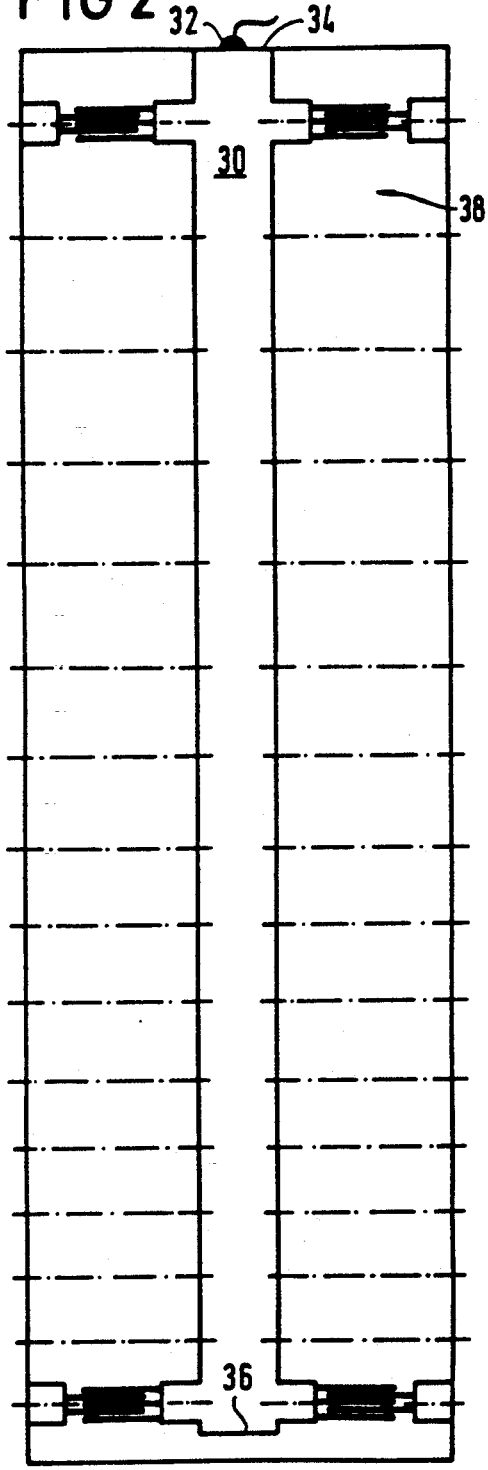

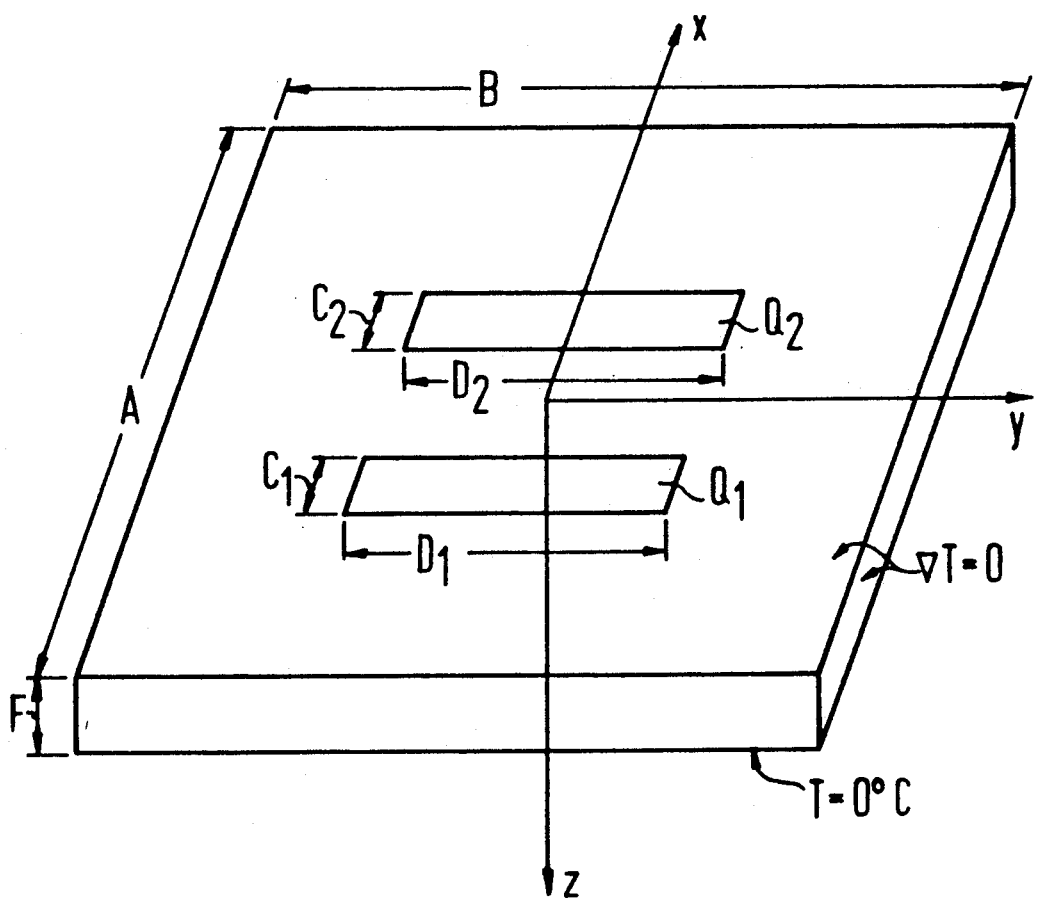

POWER TRANSISTOR HAVING MULTIFINGER CONTACTS

BACKGROUND OF THE INVENTION

The present invention is directed to a power transistor having a plurality of active transistor regions and is referred to as a multifinger transistor.

Power transistors are usually composed of individual transistors that multiply integrated side-by-side and that are provided with finger-shaped contacts. These power transistors are therefore usually referred to as multifinger transistors. An output power that is higher in comparison to individual transistors is achieved on the basis of this joining. Such a finger-shaped contact can lead to the gate of a field effect transistor (particularly a HEMT) or to an emitter of a bipolar transistor.

During operation, power transistors emit dissipated power as heat. In the case of multifinger transistors, this leads to an overheating of the middle transistors of a row of individual transistors as compared to the transistors that are located at the outside. The non-uniform heating of the individual transistors in multifinger transistors was hitherto mensurationally acquired, analyzed and described by theoretical models. A non-uniform heating can be compensated by electrical circuit measures such as, for example, resistors in the emitter circuit (see, for example, G.-B. Gao et al., "Thermal Design Studies of High Power Heterojunction Bipolar Transistors⇌, IEEE Trans. ED-36 (5) 1989, pages 854 and G.-B. Gao et al. "Emitter Ballasting Resistor Design for, and Current Handling Capability of AlGaAs/GaAs Power Heterojunction Bipolar Transistors", IEEE Trans. ED-38 (2), 1991, page 185). The allowable maximum temperature for the individual transistors lying in the middle of a row limits the maximum power input of the multifinger transistor.

In the design of integrated circuits an attempt is made to place temperature-sensitive circuit parts on isotherms (see, for example, G.-B. Gao et al., "Uniform Junction Temperature of AlGaAs/GaAs Power Heterojunction Bipolar Transistors on Silicon Substrate", Appl. Phys. Lett. 58 (10) March 1992, page 1068).

The heating of the individual transistors becomes increasingly non-uniform, the lower the thermal conductivity of the appertaining semiconductor material. As a consequence of the lower thermal conductivity of gallium arsenide (GaAs) compared to silicon, a less uniform heating than in the case of silicon can be anticipated given employment of GaAs. The various coefficients of thermal conductivity for semiconductor materials may be derived from the applicable tables.

Active transistor regions, particularly those of power transistors, represent heat sources that are for all practical purposes only two-dimensionally present at a surface of the semiconductor body. R.D. Lindsted, R.J. Surty, "Steady State Junction Temperatures of Semiconductor Chips:, IEEE Trans. ED-19(1), 1972, page 41, describes a calculation for a threedimensional, static temperature simulation from which the temperature distribution is derived on the semiconductor surface on which an individual transistor is present. The third spatial dimension lying perpendicularly thereto is required for describing the heat elimination by cooling members.

SUMMARY OF THE INVENTION

It is an object of the present invention to specify configurations for power transistors having multiple contacting, whereby an adequately uniform heating of the individual transistors is established.

This object is achieved with a power transistor having a plurality of monolithically integrated, contacted individual transistors arranged in one plane. Finger-shaped contacts thereof are arranged such that they break a translation or mirror symmetry defined by one or more common contact surfaces. As a result thereof, the temperature during operating of the power transistor in a predetermined range of electrical nominal power remains spatially constant in every plane that lies parallel to the plane of the arrangement of the individual transistors at least to such an extent that no overheating occurs of a part of the existing individual transistors that would deteriorate the functioning of the power transistor.

Advantageous developments of the present invention are as follows.

The surface lying opposite the individual transistors is connected to a heat sink and the remaining surfaces are at least approximately thermally insulated. The arrangement of the finger-shaped contacts corresponds to a numerical solution of the static thermal conduction equation $\Delta T (x, y, z) = 0$ by means of fast Fourier analysis. The equation $- K (T) \nabla T (x, y, 0) = Q (x, y, 0)$, having a material-dependent and temperature-dependent thermal conduction coefficient K and locus-dependent heat sources Q, functions as a boundary condition in the region of the contacts.

Finger-shaped contacts are arranged laterally along a strip-shaped contact surface for which a power supply is provided at only one end. In this embodiment the spacings of successive contacts from the end of the contact surface provided for the power supply to the other end decrease strictly monotonously.

Finger-shaped contacts are arranged laterally along a strip-shaped contact surface for which a power supply is provided at both ends. In this alternative embodiment the spacings of contacts following one another in a longitudinal direction of this contact surface vary relative to one another and are mirror-symmetrical relative to a straight line proceeding perpendicularly to the longitudinal direction of the strip-shaped contact surface through the middle thereof. The spacings of the finger-shaped contacts following one another in the longitudinal direction in a respective row are approximately identical with the exception of the spacings present in the middle and at the ends. However, two middle contacts following one another have a smaller spacing compared thereto and a greater spacing to the contacts following in both directions. The contacts situated at the ends have a smaller spacing compared thereto with respect to the respectively following contact.

The present invention is also an array composed of a plurality of the above-described novel power transistors that are integrated in common and provided with electrical terminals and that are arranged at such intervals relative to one another that the temperature during operation of the array remains spatially constant to such an extent that no overheating occurs of individual power transistors that would deteriorate the functioning of the array.

The inventive fashioning of the power transistors is based on the perception that the non-uniform heating given uniformly loaded individual transistors is based on the identical spacing of the finger-shaped contacts vis-a-vis one another. With a simulation calculation for the temperature distribution, the spacings of the contacts of the individual transistors in a multifinger transistor can be defined such that the same maximum temperature, given operation in a prescribed range of the electrical nominal power, is at least approximately achieved for all individual transistors. This uniform temperature distribution enhances the efficiency of the overall transistor and protects against a partial overheating of the multifinger transistor.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIGS. 1 and 2 show arrangements of the contacts for two embodiments of the transistor of the present invention; and FIG. 3 shows a perspective plan view of a semiconductor member provided with two contacts, reference characters for various dimensionings being entered therein.

DESCRIPTION OF THE PREFERRED EMBODIMENT

In the power transistor of the present invention, the multifinger contacts for every individual transistor are arranged at such intervals from one another that the transistor heats at least approximately uniformly when it is operated at a value or in a range of the electrical nominal power for which it is provided. In FIG. 1, for example, a central contact 10 (for example, base) edged strip-shaped and tine-shaped or sawtooth-shaped is depicted. Each of the tineshaped projections 12 ends in three contact fingers 14 that respectively mesh with two contact fingers 16 of opposed contacts 18 (for example, emitter, collector). The spacings of these individual transistors respectively defined by a set of contact fingers vary relative to those following in a row. For the sake of clarity, only the contact fingers at the start and end of the row are shown in FIGS. 1 and 2 and the remaining contact fingers are indicated by strokes or dot-dash lines. In the illustrated arrangements wherein the central contact 10 is connected to a power supply at both ends 26, 28 thereof, the middle individual transistors would heat more than those located at the edge if, as currently standard, identical spacings were selected for the transistors vis-a-vis one another. Inventively, the spacings of the individual transistors are established such that the heating occurs approximately uniformly, so that approximately the same temperature occurs over the entire row of individual transistors during operation. As may be seen, the spacings of the transistors relative to one another are approximately identical in this exemplary embodiment, with the exception of the innermost and outermost individual transistors of a row. The respectively two innermost transistors are placed closer together, so that their spacing 20 from one another is reduced and the spacings 22 to the transistors respectively adjoining toward the outside is enlarged. The transistors situated at the end of every row are likewise placed closer to the others with reduced spacings 24.

In the embodiment of FIG. 2, the current is applied to the middle contact 30 at only one end 34. It is inventively expedient here for the individual transistors that are located closer to the power terminal 32 to have greater intervals from one another. The intervals 38 constantly decrease toward the other end 36 of the central contact 30. This takes the condition into consideration that the voltage drop-off along the central contact 30 effects a reduction of the cutoff voltage of the transistor and that this reduction is compensated by an intentional heating by means of smaller contact spacings.

A plurality of the depicted two-row contact arrangements can also be arranged in parallel and can be combined to form a transistor array. For example, contacts lying side-by-side are then expediently arranged offset relative to one another. What is important to the power transistor of the present invention in any case is that a translation symmetry defined by the arrangement of the contacts is broken, i.e. cancelled in a direction defined in some manner (for example, stripshaped central contact) or a correspondingly present mirror symmetry is broken, i.e. cancelled by the arrangement of the finger contacts of the individual transistors such (for example non-uniform spacings in the longitudinal direction established by the strip-shaped contact) that the temperature distribution during operation of the transistor occurs uniformly. Since a non-uniform or asymmetrical arrangement of the individual contacts configured in some manner does not necessarily lead to a uniform temperature distribution, it is expedient when the spacings of the individual contacts relative to one another take the physical laws into consideration.

FIG. 3 shows a semiconductor member in a perspective plan view by way of example for explaining these physical foundations, two heat sources $Q_1$ and $Q_2$ (corresponding to the contacts) being situated on the surface thereof. Let this semiconductor member in the form of a flat cuboid have the dimensions A and B as well as the thickness F. Since a heat sink is advantageously applied to the backside of the power transistor or the transistor is mounted on such a heat sink, a constant temperature (for example, 0° C.) can be assumed for the surface lying opposite the heat sources. The remaining surfaces of the semiconductor member are considered thermically insulated from the outside world ($\nabla T = 0$). The heat sources $Q_1$ and $Q_2$ located at the surface and assumed to be rectangular have the dimensions $C_1$, $D_1$, $C_2$ and $D_2$. When the transistors ARE placed in operation, a static temperature distribution occurs after a defined starting time, the static thermal conduction equation $\nabla T = 0$ applying thereto. This thermal conduction equation can be used for calculating the spatial temperature distribution $T(x, y, z)$. The equations deriving from the boundary conditions allow the integration of this thermal conduction equation. The boundary conditions can be mathematically formulated in the following way:

$T$ = constant at the back side of the semiconductor member;

$\nabla T = 0$ on the remaining, free surface of the semiconductor member; $- K \nabla T = Q$ at the surfaces occupied by the heat sources; whereby Q is respectively $Q_1$ or $Q_2$. The coefficient of thermal conduction K is dependent on the material of the semiconductor member and on the temperature. The heat sources in turn are dependent on the spatial coordinates that are critical for them. A coordinate system having three orthogonal directions is shown in FIG. 3.

In order to limit the required calculating outlay for various, possible designs of the contact arrangement (singlerow, multi-row, rectangular arrangement), the indicated equation system is advantageously numerically solved using the method of fast Fourier transformation (see, for example, William H. Press et al., "Numerical Recipes. The Art of Scientific Computing", Cambridge University Press (1989)). The calculation that is recited in the publication IEEE Trans. ED-19, 41 (1972) and that is only implemented for a single contact strip can be implemented in this manner for an arbitrary plurality and arrangement of contacts on the transistor surface. The thermal distribution to be anticipated can thus be calculated in an efficient manner for what are in principle arbitrary designs. The only thing required for this purpose is that the dissipated power of an individual contact finger that happens to be dependent on the design or on the configuration of the contacts was identified with a measurement for a specimen transistor for the intended design. This dissipated power is also dependent on the provided nominal power. The range of electrical nominal power wherein the transistor is to be operated is therefore also to be taken into consideration. Further parameters that are critical for the calculation are the dimensions and the respective position of the contact fingers (in FIG. 3, the x, y, z-coordinates and the dimensions $C_1$, $C_2$, $D_1$ and $D_2$), as well as the semiconductor member dimensions A, B and F. The temperature distribution for various arrangements of the contacts for the provided power range of the transistor is identified in this manner for every semiconductor material and transistor design. An arrangement of the contacts wherein the temperature distribution is substantially uniform for the provided power in order to avoid overheating of individual transistors is therefore identified in a systematic way. The various embodiments of the power transistor of the present invention are recited in a relatively simple manner for the respectively provided power of the transistor with these numerical calculations. Conversely, it is also possible to at least approximately identify the anticipated temperature distribution for a given exemplary embodiment and a provided power range.

The described power transistor (bipolar transistor, FET, HEMT and the like) makes it possible in the simple manner to accommodate a plurality of individual transistors monolithically integrated on a semiconductor member without having the power limited by overheating of individual transistors or without requiring complicated circuit-oriented modifications. It is likewise possible to arrange a plurality of such (multifinger) power transistors in integrated fashion and, potentially, with common electrical terminals, for example in rows and columns as an array. The spacings of power transistors relative to one another occurring in the array are then inventively adapted such that a uniform temperature distribution over this array is achieved, i.e. such that the temperature during operation of the array remains spatially constant to such an extent that no overheating of individual transistors occurs to deteriorate the functioning of individual transistors or of the entire array.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A power transistor comprising: a plurality of monolithically integrated, contacted individual transistors arranged in a single plane; the transistors having finger-shaped contacts, said finger-shaped contacts being arranged along a stripshaped contact surface to which a power feed is provided at only a first end of the strip-shaped contact surface; and spacings of successive contacts from said first end of said contact surface decreasing strictly monotonously to a second end of the contact surface.

2. The power transistor according to claim 1, wherein the individual transistors are arranged on a first surface of a semiconductor member and wherein a second surface of the semiconductor member lying opposite the first surface of the individual transistors is connected to a heat sink and remaining surfaces of the semiconductor member are at least approximately thermally insulated, and wherein the finger-shaped contacts are arranged such that a temperature distribution of the power transistor is substantially uniform, said temperature distribution being determined by a numerical solution of a static thermal conduction equation, $\Delta T (x, y, z) = 0$, by means of fast Fourier analysis, where an equation $- K (T) \nabla T (x, y, 0) = Q (x, y, 0)$ having a material-dependent and temperaturedependent thermal conduction coefficient K and at least one locusdependent heat source Q functions as boundary condition in the region of the contacts.

3. The power transistor according to claim 1, wherein a plurality of power transistors forms an array, and wherein the plurality of power transistors are integrated in common, provided with electrical terminals and arranged at such intervals relative to one another that a temperature distribution during operation of the array is substantially uniform.

4. A power transistor, comprising:
   a plurality of monolithically integrated, contacted individual transistors arranged in a single plane, each of said transistors having finger shaped contacts;
   at least one common strip-shaped contact along which said individual transistors are arranged, respective finger shaped contacts thereby defining a position of a respective individual transistor on said strip-shaped contact, spacings being provided between said individual transistors;
   at least some of said spacings being different in terms of size such that, during operation of the power transistor in a predetermined range of electrical nominal power, temperature distribution of the power transistor is substantially uniform.

5. The power transistor according to claim 4, wherein the individual transistors are arranged on a first surface of a semiconductor member and wherein a second surface of the semiconductor element lying opposite the individual transistors is connected to a heat sink and remaining surfaces of the semiconductor element are at least approximately thermally insulated, and wherein the finger-shaped contacts are arranged such that a temperature distribution of the power transistor is substantially uniform, said temperature distribution being determined by a numerical solution of a static thermal conduction equation, $\Delta T (x, y, z) = 0$, by means of fast Fourier analysis, where an equation $- K (T) \nabla T (x, y, 0) = Q (x, y, 0)$ having a material-dependent and temperaturedependent thermal conduction coefficient K and at least one locusdependent heat source Q functions as boundary condition in the region of the contacts.

6. The power transistor according to claim 4, wherein finger-shaped contacts are arranged laterally along a stripshaped contact surface to which a power supply is connected at only one end thereof, and wherein spacings of successive contacts from the end of the contact surface connected to the power supply to the other end decrease strictly monotonously.

7. The power transistor according to claim 4, wherein finger-shaped contacts are arranged laterally along a strip-shaped contact surface to which a power supply is connected at both ends thereof, and wherein spacings of contacts following one another in a longitudinal direction of the contact surface vary relative to one another and are mirror-symmetrical relative to a straight line proceeding perpendicularly to the longitudinal direction of the strip-shaped contact surface through a middle thereof.

8. The power transistor according to claim 7, wherein the spacings of the finger-shaped contacts following one another in the longitudinal direction in a respective row are approximately identical with the exception of spacings present in a middle and at the ends, two middle contacts adjacent one another having a smaller spacing compared to spacing of the contacts extending in both directions from the two middle contacts, and respective contacts situated at the ends having a smaller spacing compared to respectively following contacts.

9. The power transistor according to claim 7, wherein a plurality of power transistors forms an array, and wherein the plurality of power transistors are integrated in common, provided with electrical terminals and arranged at such intervals relative to one another that a temperature distribution during operation of the array is substantially uniform.

10. A power transistor comprising:
   a plurality of monolithically integrated, contacted individual transistors arranged in a single plane on a first surface of a semiconductor member, each of said transistors having finger shaped contacts;
   at least one common strip-shaped contact along which said individual transistors are arranged, respective finger shaped contacts thereby defining a position of a respective individual transistor on said strip-shaped contact, spacings being provided between said individual transistors;
   at least some of said spacings being different in terms of size such that, during operation of the power transistor in a predetermined range of electrical nominal power, temperature distribution of the power transistor is substantially uniform; and
   a second surface of the semiconductor member lying opposite the first surface having the individual transistors connected to a heat sink and remaining surfaces of the semiconductor member being at least approximately thermally insulated, wherein the finger-shaped contacts are arranged such that a temperature distribution of the power transistor is substantially uniform, said temperature distribution of the power transistor is substantially uniform, said temperature distribution being determined by a numerical solution of a static thermal conduction equation, $\Delta T (x, y, z) = 0$, by means of fast Fourier analysis, where an equation $- K (T) \nabla T (x, y, 0) = Q (x, y, 0)$ having a material-dependent and temperature-dependent thermal conduction coefficient K and at least one locus-dependent heat source Q functions as boundary condition in the region of the contacts.

11. The power transistor according to claim 10, wherein finger-shaped contacts are arranged laterally along a stripshaped contact surface to which a power supply is connected at only one end thereof, and wherein spacings of successive contacts from the end of the contact surface connected to the power supply to the other end decrease strictly monotonously.

12. The power transistor according to claim 10, wherein finger-shaped contacts are arranged laterally along a stripshaped contact surface to which a power supply is connected at both ends thereof, and wherein spacings of contacts following one another in a longitudinal direction of the contact surface vary relative to one another and are mirror-symmetrical relative to a straight line proceeding perpendicularly to the longitudinal direction of the strip-shaped contact surface through a middle thereof.

13. The power transistor according to claim 12, wherein spacings of the finger-shaped contacts following one another in the longitudinal direction in a respective row are approximately identical with the exception of spacings present in a middle and at the ends, two middle contacts adjacent one another having a smaller spacing compared to spacing of contacts following in both directions, and respective contacts situated at the ends having a smaller spacing compared to respectively following contacts.

14. The power transistor according to claim 12, wherein a plurality of power transistors forms an array, and wherein the plurality of power transistors are integrated in common, provided with electrical terminals and arranged at such intervals relative to one another that a temperature distribution during operation of the array is substantially uniform.

15. A power transistor comprising:
   a plurality of monolithically integrated, contacted individual transistors arranged in a single plane, the transistors having finger-shaped contacts;
   the finger-shaped contacts arranged laterally along a stripshaped contact surface to which a power supply is connected at both ends thereof;
   spacings of contacts following one another in a longitudinal direction of the contact surface varying relative to one another and mirror-symmetrical relative to a straight line proceeding perpendicularly to the longitudinal direction of the stripshaped contact surface through a middle thereof; and
   the spacings of the finger-shaped contacts following one another in the longitudinal direction in a respective row being approximately identical with the exception of spacings present in a middle and at the ends, two middle contacts adjacent one another having a smaller spacing compared to spacing of contacts following in both directions, and respective contacts situated at the ends having a smaller spacing compared to respectively following contacts.

16. The power transistor according to claim 15, wherein the individual transistors are arranged on a first surface of a semiconductor member and wherein a second surface of the semiconductor member lying opposite the first surface of the individual transistors is connected to a heat sink and remaining surfaces of the semiconductor member are at least approximately thermally insulated, and wherein the finger-shaped contacts are arranged such that a temperature distribution of the power transistor is substantially uniform, said temperature distribution being determined by a numerical solution of a static theraml conduction equation, $\Delta T (x, y, 0) = 0$, by means of fast Fourier analysis, where an equation $- K (T) \nabla T (x, y, 0) = Q (x, y, 0)$ having a material-dependent and temperature-dependent thermal conduction coefficient K and at least one locus-dependent heat source Q functions as boundary condition in the region of the contacts.

17. The power transistor according to claim 15, wherein a plurality of power transistors forms an array, and wherein the plurality of power transistors are integrated in common, provided with electrical terminals and arranged at such intervals relative to one another that a temperature distribution during operation of the array is substantially uniform.

* * * * *